United States Patent
Abedifard et al.

(10) Patent No.: US 6,657,913 B2
(45) Date of Patent: Dec. 2, 2003

(54) ARRAY ORGANIZATION FOR HIGH-PERFORMANCE MEMORY DEVICES

(75) Inventors: Ebrahim Abedifard, Sunnyvale, CA (US); Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/134,837

(22) Filed: Apr. 29, 2002

(65) Prior Publication Data

US 2002/0125538 A1 Sep. 12, 2002

Related U.S. Application Data

(62) Division of application No. 09/628,145, filed on Jul. 28, 2000, now Pat. No. 6,396,728.

(51) Int. Cl.$^7$ .................................................. G11C 7/00
(52) U.S. Cl. ....................... 365/230.03; 365/63; 365/51
(58) Field of Search ............................. 365/230.03, 63, 365/51, 185.05, 185.11

(56) References Cited

U.S. PATENT DOCUMENTS

| | | |
|---|---|---|
| 5,041,886 A | 8/1991 | Lee |
| 5,185,718 A | 2/1993 | Rinerson et al. |
| 5,506,811 A | 4/1996 | McLaury |
| 5,537,354 A | 7/1996 | Mochizuki et al. |
| 5,600,605 A | 2/1997 | Schaefer |
| 5,646,429 A | 7/1997 | Chevallier |
| 5,666,321 A | 9/1997 | Schaefer |
| 5,724,301 A | 3/1998 | Seyyedy |
| 5,734,620 A | 3/1998 | Seyyedy |
| 5,751,039 A | 5/1998 | Kauffman et al. |
| 5,787,457 A | 7/1998 | Miller et al. |
| 5,801,996 A | 9/1998 | Seyyedy et al. |
| 5,886,943 A * | 3/1999 | Sekiguchi et al. ..... 365/230.03 |
| 5,894,437 A | 4/1999 | Chang et al. |
| 5,936,903 A | 8/1999 | Jeng et al. |
| 5,946,232 A | 8/1999 | Yoon |
| 5,953,739 A | 9/1999 | Zagar et al. |
| 5,995,438 A | 11/1999 | Jeng et al. |
| 6,026,465 A | 2/2000 | Mills et al. |
| 6,077,211 A | 6/2000 | Vo |
| 6,134,144 A | 10/2000 | Lin et al. |
| 6,137,133 A | 10/2000 | Kauffman et al. |
| 6,141,247 A | 10/2000 | Roohparvar et al. |

OTHER PUBLICATIONS

Keeth, et al., "DRAM circuit design: a tutorial," IEEE Press, 2001, pp. 16–23, 142–153.

Micron Semiconductor Products, Inc., "2Mb, Smart 5 BIO-S–Optimized Boot Block Flash Memory," *Flash Memory* www.micron.com, copyright 2000, Micron Technology, Inc., pp. 1–12.

Micron, "16 Mb: x16 SDRAM" *Synchronous DRAM*, www.micron.com, copyright 1999 Micron Technology, Inc., pp. 1–51.

* cited by examiner

*Primary Examiner*—Vu A. Le
(74) *Attorney, Agent, or Firm*—Leffert Jay & Polglaze, P.A.; Thomas W. Leffert

(57) ABSTRACT

Memory devices including blocks of memory cells arranged in columns, with each column of memory cells coupled to a main bit line, are organized for high-speed access and tight packing. Such memory devices include sector bit lines having multiple main bit lines selectively coupled to each sector bit line, with each sector bit line extending to main bit lines in each memory block of a memory sector. Sector bit lines are coupled to sensing devices and the output of each sensing device is selectively coupled to a global bit line, with each global bit line selectively coupled to more than one sensing device. The global bit lines are multiplexed and input to helper flip-flops for output to the data output register of the memory device. Various embodiments include non-volatile, and, particularly, synchronous non-volatile memory devices having multiple banks containing multiple sectors of such memory blocks.

59 Claims, 10 Drawing Sheets

| Pin | # | # | Pin |
|---|---|---|---|
| Vcc | 1* | 54 | Vss |
| DQ0 | 2 | 53 | DQ15 |
| VccQ | 3 | 52 | VssQ |
| DQ1 | 4 | 51 | DQ14 |
| DQ2 | 5 | 50 | DQ13 |
| VssQ | 6 | 49 | VccQ |
| DQ3 | 7 | 48 | DQ12 |
| DQ4 | 8 | 47 | DQ11 |
| VccQ | 9 | 46 | VssQ |
| DQ5 | 10 | 45 | DQ10 |
| DQ6 | 11 | 44 | DQ9 |
| VssQ | 12 | 43 | VccQ |
| DQ7 | 13 | 42 | DQ8 |
| Vcc | 14 | 41 | Vss |
| DQML | 15 | 40 | RP# |
| WE# | 16 | 39 | DQMH |
| CAS# | 17 | 38 | CLK |
| RAS# | 18 | 37 | CKE |
| CS# | 19 | 36 | VccP |
| BA0 | 20 | 35 | A11 |
| BA1 | 21 | 34 | A9 |
| A10 | 22 | 33 | A8 |
| A0 | 23 | 32 | A7 |
| A1 | 24 | 31 | A6 |
| A2 | 25 | 30 | A5 |
| A3 | 26 | 29 | A4 |
| Vcc | 27 | 28 | Vss |

ARRAY ORGANIZATION FOR HIGH-PERFORMANCE MEMORY DEVICES

RELATED APPLICATION

This application is a divisional of U.S. patent application Ser. No. 09/628,145 filed Jul. 28, 2000 and commonly assigned, now U.S. Pat. No. 6,396,728 issued May 28, 2002, the entire contents of which are incorporated by reference herein.

TECHNICAL FIELD OF THE INVENTION

The present invention relates generally to semiconductor memory devices, and in particular, the present invention relates to organization of memory arrays for global bit-line architecture in high-performance semiconductor memory devices.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

As memory sizes continue to increase, satisfying the demands for high-speed access of memory arrays becomes increasingly difficult. Increasing memory sizes have been made possible in large part by continuing advances in semiconductor fabrication, i.e., placing more transistors and interconnect lines in the same die area. However, reduced dimensions of transistors leads to lower drive while reduced dimensions of interconnect lines leads to increased resistance. Managing this reduced drive and higher resistance through array organization thus becomes an important factor in providing high-speed access in high-performance memory devices.

For the reasons stated above, and for other reasons stated below which will become apparent to those skilled in the art upon reading and understanding the present specification, there is a need in the art for alternate array architectures for high-performance memory devices.

SUMMARY OF THE INVENTION

The above-mentioned problems with memory devices and other problems are addressed by the present invention and will be understood by reading and studying the following specification.

Various embodiments of the invention have architectures suited for high-performance memory devices, with particular reference to synchronous non-volatile memory devices. Memory devices in accordance with the various embodiments of the invention include blocks of memory cells arranged in columns with each column of memory cells coupled to a main bit line. Such memory devices further include sector bit lines having multiple main bit lines coupled to each sector bit line through selective coupling devices with each sector bit line extending to main bit lines in each memory block of a memory sector. Sector bit lines are coupled to sensing devices and the output of each sensing device is coupled to a global bit line through a selective coupling device, with each global bit line coupled to more than one sensing device through the selective coupling devices. For embodiments having multiple sectors, the global bit lines may extend to more than one sector. The global bit lines are multiplexed and input to helper flip-flops for output to the data output registers of the memory device. This array organization permits tight packing of individual memory cells with high-speed access capabilities.

For one embodiment, the invention provides a memory array. The memory array includes a first memory block having columns of memory cells coupled to main bit lines of the first memory block, a second memory block having columns of memory cells coupled to main bit lines of the second memory block, sector bit lines coupled to main bit lines in both memory blocks, sensing devices coupled to the sector bit lines, and at least one global bit line selectively coupled to the sensing devices. Each sector bit line is selectively coupled to at least two main bit lines of each memory block.

For another embodiment, the invention provides a memory bank. The memory bank includes a first number of memory sectors each having a second number of memory blocks, each memory block having a third number of columns of non-volatile memory cells with each column of non-volatile memory cells coupled to a main bit line. The memory bank further includes a fourth number of sector bit lines in each memory sector, wherein each sector bit line extends to each memory block in its associated memory sector and wherein the fourth number is one-half the third number. The memory bank still further includes a plurality of block pass transistors, wherein one block pass transistor is coupled between each main bit line and a sector bit line to selectively couple each main bit line to a sector bit line, and wherein each main bit line is selectively coupled to only one sector bit line and each sector bit line is selectively coupled to two main bit lines in each memory block. The memory bank still further includes a plurality of sense amplifiers in each memory sector, wherein each sense amplifier is coupled to two sector bit lines in its associated memory sector, and a plurality of global bit lines, wherein each output of a sense amplifier is coupled to only one global bit line through a selective coupling device and each global bit line is coupled to an output of more than one sense amplifier in each memory sector of the memory bank through selective coupling devices.

For still another embodiment, the invention provides a memory array. The memory array includes at least one memory bank, each memory bank having at least one memory sector. Each memory sector includes at least two memory blocks, each memory block having columns of non-volatile memory cells coupled to a plurality of main bit lines and a plurality of sector bit lines, wherein each sector bit line extends to each memory block of its associated memory sector. Each memory sector further includes a plurality of block pass transistors coupled between each plurality of main bit lines and the plurality of sector bit lines to selectively couple each main bit line to a sector bit line, wherein each main bit line is selectively coupled to only one sector bit line of its associated memory sector and each sector bit line is selectively coupled to more than one main bit line of its associated memory sector. Each memory sector still further includes a plurality of sense amplifiers coupled to the plurality of sector bit lines, wherein each sense amplifier is coupled to two sector bit lines of its associated memory sector, and a plurality of global bit lines, wherein an output of each sense amplifier is selectively coupled to only one global bit line and each global bit line is selectively coupled to an output of more than one sense amplifier of each memory sector of its associated memory bank.

For a further embodiment, the invention provides a synchronous flash memory device. The memory device includes a plurality of memory banks containing non-volatile flash memory cells and a command execution logic coupled to the plurality of memory banks for receiving at least a system clock input signal and for generating commands to control operations performed on the plurality of memory banks for synchronization to a system clock. Each memory bank includes a first number of memory sectors each having a second number of memory blocks, with each memory block having a third number of columns of non-volatile flash memory cells where each column of non-volatile flash memory cells is coupled to a main bit line. Each memory bank further includes a fourth number of sector bit lines in each memory sector, wherein each sector bit line extends to each memory block in its associated memory sector and wherein the fourth number is one-half the third number. Each sector bit line is selectively coupled to two main bit lines in each memory block while each main bit line is selectively coupled to only one sector bit line. Each memory bank further includes a plurality of sense amplifiers in each memory sector, wherein each sense amplifier is coupled to two sector bit lines in its associated memory sector, and a plurality of global bit lines, wherein an output of each sense amplifier is selectively coupled to only one global bit line and each global bit line is selectively coupled to an output of more than one sense amplifier in each memory sector of the memory bank.

The invention further provides methods and apparatus of varying scope.

BRIEF DESCRIPTION OF THE DRAWINGS

FIG. 2A is a top view of a memory assembly showing a package pin assignment diagram in accordance with the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
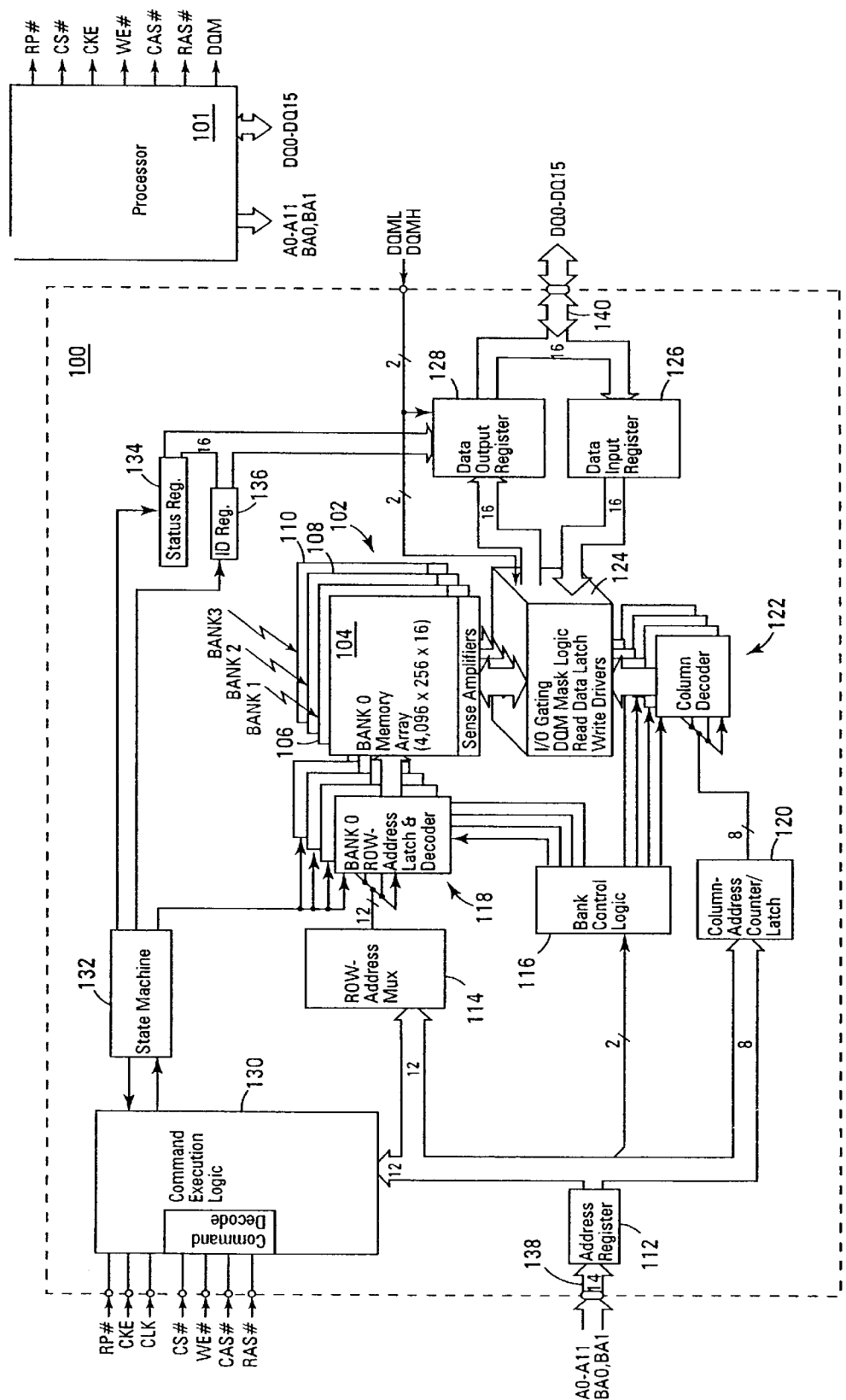
FIG. 1 is a block diagram of a memory device in accordance with the invention.

FIG. 1 is a block diagram of one embodiment of a synchronous memory device in accordance with the invention. The memory device 100 includes an array of non-volatile flash memory cells 102 having an organization as described herein. All access commands to the array 102 of the memory device 100 are synchronized to a system clock input signal (CLK), thus the memory device 100 may be referred to as a synchronous flash memory device or synchronous non-volatile memory device. However, memory array organization in accordance with the various embodiments described herein is not limited to synchronous memory devices.

The array 102 is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided addresses may come, for example, from a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output (I/O) gating, data mask logic, read data latch circuitry and write driver circuitry. Data is input through data input registers 126 and output through data output registers 128 using a plurality of data inputs/outputs 140. The data inputs/outputs 140 may be coupled to, for example, the processor 101 of an electronic system. Command execution logic 130 is provided to generate commands to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 1 may be fabricated on a substrate, such as a semiconductor wafer, and may be referred to as a memory chip.

FIG. 2A illustrates an interconnect pin assignment of one embodiment of the present invention as a memory assembly having a pin layout substantially similar to a standard SDRAM 54-pin TSOP (thin small-outline package) package. Accordingly, the memory assembly has a memory package 150 having 54 interconnect pins and a memory device (not shown) in accordance with the invention. The memory device is contained in the memory package 150. The address inputs, data inputs/outputs, power inputs and clock and control signal inputs of the memory device are coupled to the interconnect pins of the memory package 150 in a conventional manner. Two interconnects shown in the embodiment of FIG. 2A and not present in standard SDRAM packages include control signal RP# and power input VccP. Although knowledge of the function of the various clock and control signals and the various power inputs is not essential to understanding the present invention, a detailed discussion is included in U.S. patent application Ser. No. 09/567,773 filed May 10, 2000 and titled, "Flash with Consistent Latency," which is commonly assigned.

Figure 2B:
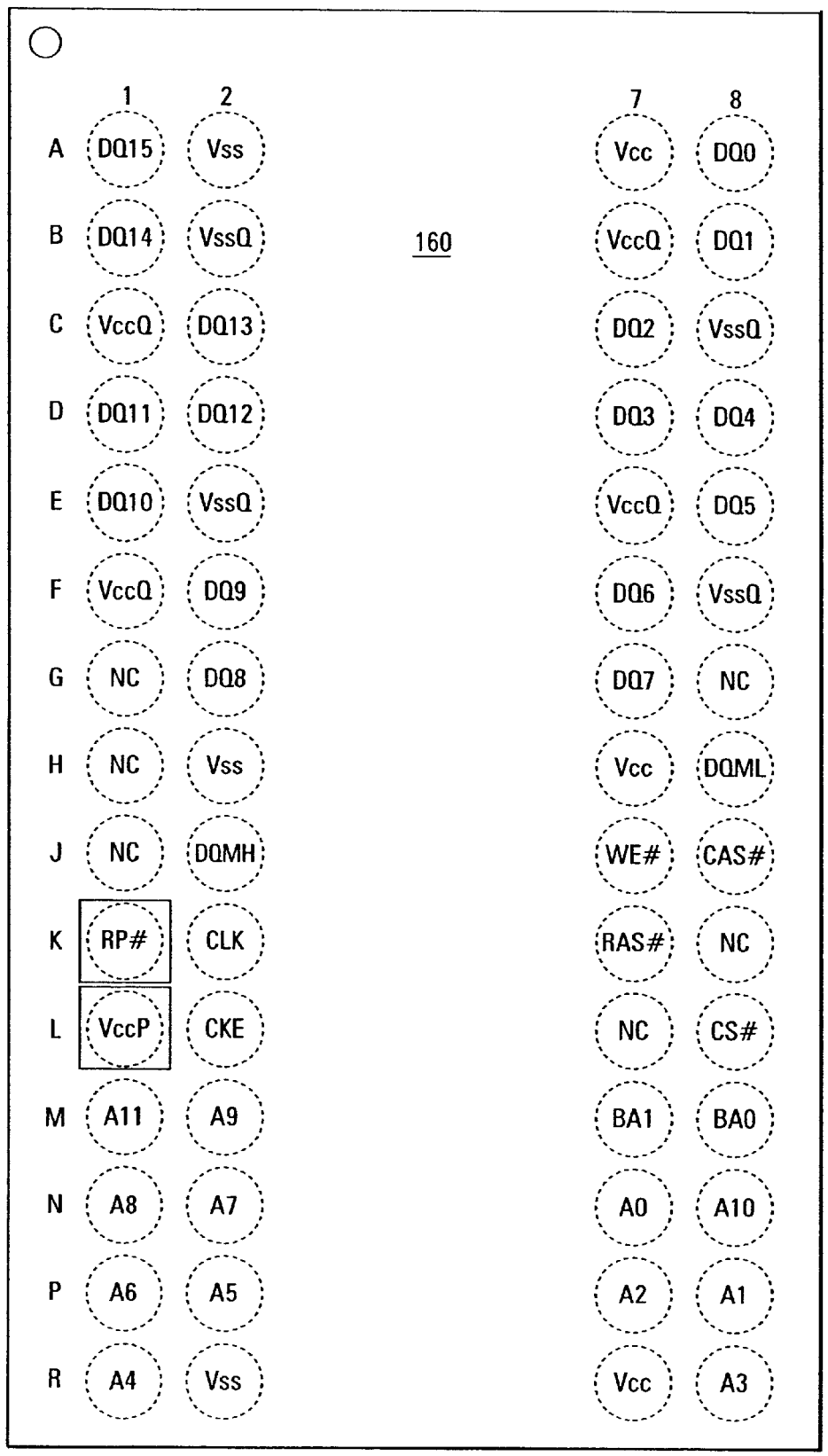
FIG. 2B is a top view of a memory assembly showing a package bump assignment diagram in accordance with the invention.

FIG. 2B illustrates a bump assignment of one embodiment of the present invention as a memory assembly having a bump layout substantially similar to an industry standard SDRAM 60-bump FBGA (fine-pitch ball grid array) package. Memory package 160 is generally similar to memory package 150 except that the interconnects of memory package 160 have bump connections instead of the pin connections of memory package 150. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing arrays having an organization in accordance with the various embodiments of the invention.

Figure 3:
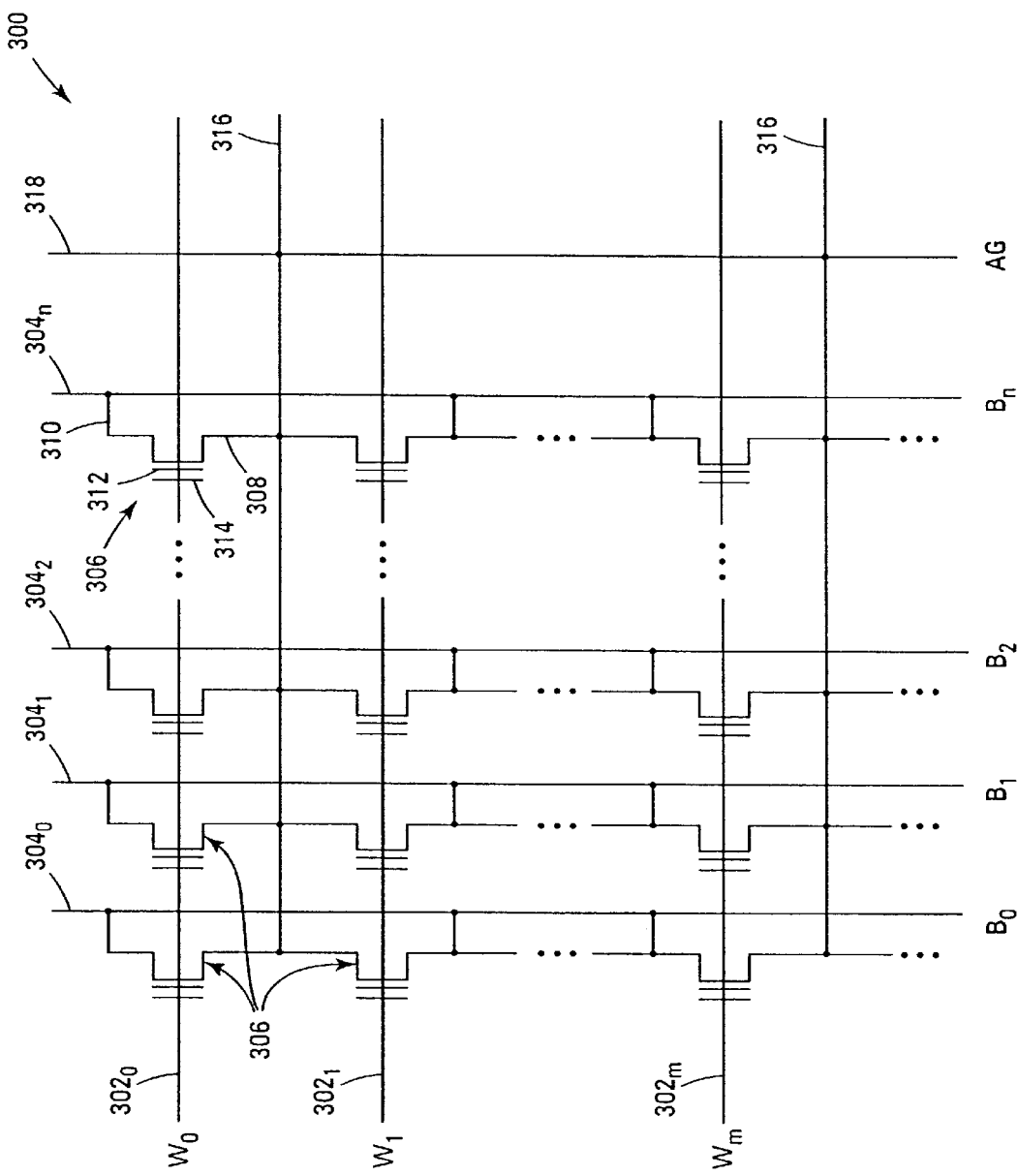
FIG. 3 is a schematic of a portion of a memory block in accordance with one embodiment of the invention.

Arrays of non-volatile memory cells are often configured as floating gate transistors placed at the intersection of word lines and bit lines. The word lines are coupled to the control gates of the floating gate transistors. FIG. 3 is a schematic of a portion of a non-volatile memory block 300 as a portion of a memory array in accordance with one embodiment of the invention.

The detail of memory block 300 is provided to better understand the various embodiments of the invention. However, other memory blocks containing columns of memory cells coupled to bit lines are suited for use in the invention. Accordingly, the invention is not limited to the specific floating-gate memory cell and layout described with reference to FIG. 3.

As shown in FIG. 3, the memory block 300 includes word lines 302 and intersecting main bit lines 304. For ease of addressing in the digital environment, the number of word lines 302 and the number of bit lines 304 are each some power of two, e.g., 256 word lines 302 by 4,096 bit lines 304. The main bit lines 304 may be selectively coupled to global bit lines in accordance with the invention, i.e., no more than one main bit line 304 may be in electrical communication with any given global bit line in normal operation, with remaining main bit lines 304 being electrically isolated from that global bit line.

Floating gate transistors 306 are located at each intersection of a word line 302 and a main bit line 304. The floating gate transistors 306 represent the non-volatile memory cells for storage of data. Typical construction of such floating gate transistors 306 include a source 308 and a drain 310 constructed from an N+-type material of high impurity concentration formed in a P-type semiconductor substrate of low impurity concentration, a channel region formed between the source and drain, a floating gate 312, and a control gate 314. Floating gate 312 is isolated from the channel region by a tunneling dielectric and from the control gate 314 by an intergate dielectric. The materials of construction are not critical to the invention, but commonly include doped polysilicon for the gate materials, and silicon oxides, nitrides or oxynitrides for the dielectric materials. Floating gate transistors 306 having their control gates 314 coupled to a word line 302 typically share a common source 308 depicted as array source 316. As shown in FIG. 3, floating gate transistors 306 coupled to two adjacent word lines 302 may share the same array source 316. Floating gate transistors 306 have their drains coupled to a main bit line 304. A column of the floating gate transistors 306 are those transistors commonly coupled to a given main bit line 304. A row of the floating gate transistors 306 are those transistors commonly coupled to a given word line 302.

The following discussion provides examples of programming, reading and erasing memory cells of the type depicted in FIG. 3. During programming, a positive programming voltage of about 12 volts is applied to the control gate 314. This positive programming voltage attracts electrons from the P-type substrate and causes them to accumulate at the surface of channel region. A voltage on the drain 310 is increased to about 6 volts by applying the potential to the associated main bit line 304, and the source 308 is connected to an array ground 318 through the array source 316. As the drain-to-source voltage increases, electrons flow from the source 308 to the drain 310 via the channel region. As electrons travel toward the drain 310, they acquire substantially large kinetic energy and are referred to as hot electrons.

The voltages at the control gate 314 and the drain 310 create an electric field in the tunneling dielectric layer. This electric field attracts the hot electrons and accelerates them toward the floating gate 312. At this point, the floating gate 312 begins to trap and accumulate the hot electrons and starts a charging process. Gradually, as the charge on the floating gate 312 increases, the electric field in the tunneling dielectric layer decreases and eventually loses it capability of attracting any more of the hot electrons to the floating gate 312. At this point, the floating gate 312 is fully charged. The negative charge from the hot electrons collected in the floating gate 312 raises the cell's threshold voltage (Vt) above a logic 1 voltage. When a control voltage on the control gate 314 is brought to a logic 1 during a read operation, the cell will barely turn on. The control voltage is applied to a word line 302, and thus the control gate 314, in response to control signals received from a row decoder circuit. Sensing devices, such as sense amplifiers, are used in the memory to detect and amplify the state of the floating gate transistor 306 detected on the main bit line 304 during a read operation. The floating gate transistor 306 is coupled to a sense amplifier and the appropriate sense amplifier is coupled to a data output register through a global bit line in response to control signals received from a column decoder circuit. Thus, a memory cell is selected by a decoded address and data is read from the memory cell based upon its "on" characteristics.

Electrons are removed from the floating gate 314 to erase the floating gate transistor 306. Many memories, including flash memories, use Fowler-Nordheim (FN) tunneling to erase a memory cell. The erase procedure is accomplished by electrically floating the drain 310, grounding the source 308, and applying a high negative voltage (e.g., −12 volts) to the control gate 314. This creates an electric field across the tunneling dielectric layer and forces electrons off of the floating gate 312 which then tunnel through the tunneling dielectric layer. Erasures are generally carried out in blocks rather than individual cells.

To reduce problems associated with high resistance levels in the array source 316, the array source 316 is regularly coupled to a metal or other highly conductive line to provide a low-resistance path to ground. The array ground 318 serves as this low-resistance path. For one embodiment, an array ground 318 is formed using a spacing of 16 columns of memory cells. The array ground 318 is generally formed in the metal 1 (M1) layer of the semiconductor fabrication process and is coupled to multiple array sources 316 within the memory block 300.

Figure 4A:
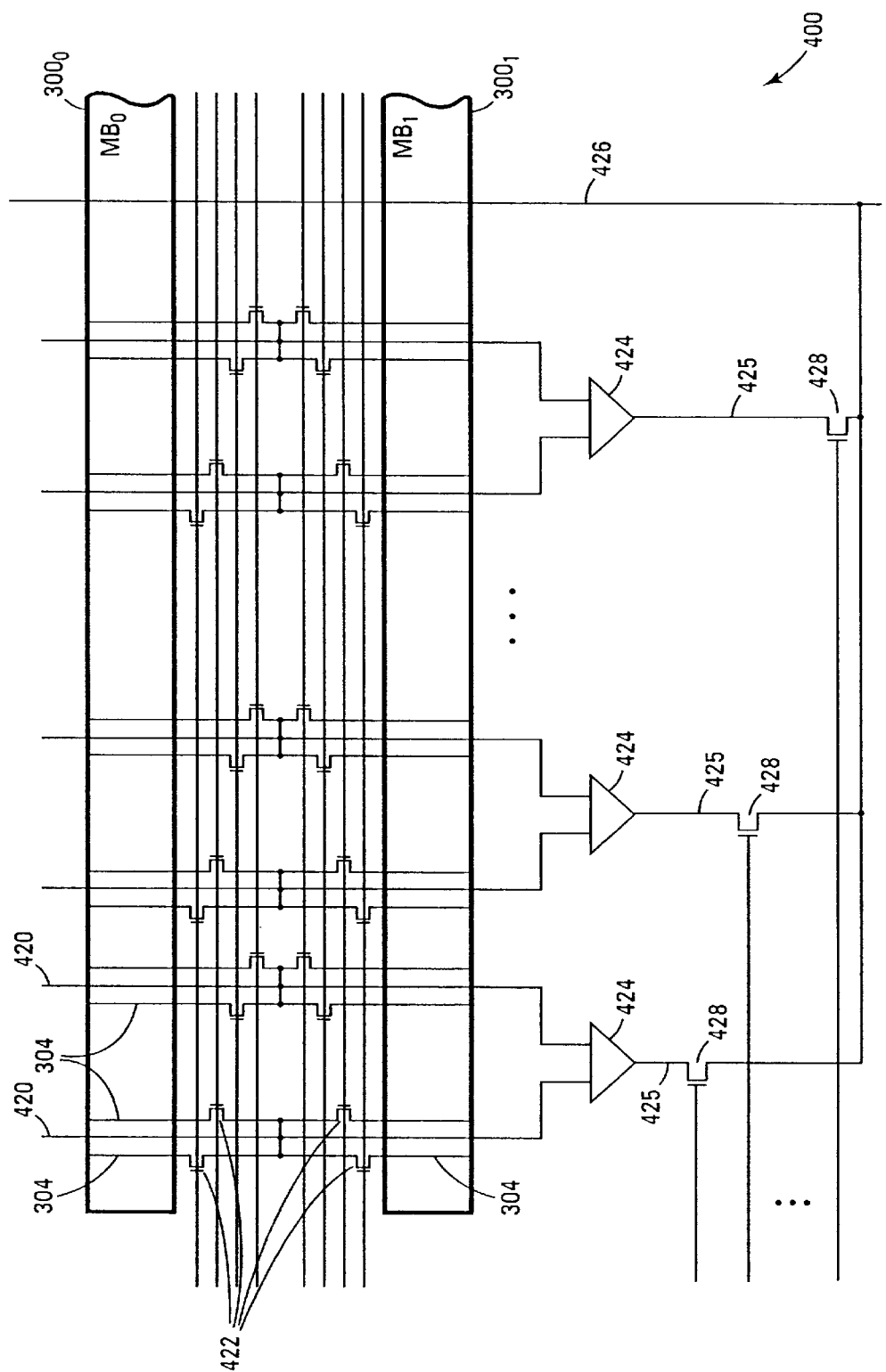
FIG. 4A is a schematic of a portion of a memory sector in accordance with one embodiment of the invention.

FIG. 4A is a schematic of a portion of a memory sector 400 in accordance with one embodiment of the invention showing the coupling of main bit lines 304 of a memory block 300 to global bit lines 426 of the memory sector 400. The memory sector 400 includes at least one and preferably two or more memory blocks 300. For ease of addressing, the number of memory blocks 300 included in a memory sector 400 is generally some power of two, and each memory block 300 preferably has the same number of rows and columns. In the embodiment of FIG. 4A, memory sector 400 includes two memory blocks $300_0$ and $300_1$ identified as main blocks $MB_0$ and $MB_1$, respectively. Each memory block 300 has a row and column organization as generally described with reference to FIG. 3. In the interest of clarity, individual memory cells are not shown in FIG. 4A. To couple an individual memory cell to a sense amplifier 424, its associated word line is activated, thus activating the target memory cell as well as other memory cells associated with the word line. Note that to simplify access circuitry, word lines may be simultaneously activated in more than one memory block 300. The main bit line 304 associated with the target memory cell is then selectively coupled to an associated sector bit line 420 such as by using a block pass transistor 422 such that all other main bit lines 304 associated with the sector bit line 420 are electrically isolated from the sector bit line 420. Block pass transistors 422 are activated in response to control signals from the row and column decoder circuits indicative of the target memory cell. Note that multiple main bit lines 304 may be simultaneously coupled to multiple associated sector bit lines 420 to read multiple data bits in the same read operation. Memory cells associated with main bit lines 304 not coupled to a sector bit line 420 are ignored, i.e., such memory cells are electrically isolated from a sensing device.

As shown in FIG. 4A, four main bit lines 304, two from each block 300, are coupled to each sector bit line 420 through selective coupling devices, such as block pass transistors 422, with each sector bit line 420 extending to two or more blocks 300. The main bit lines 304 are electrically isolated from each sector bit line 420 until actively coupled to a sector bit line 420 through their associated block pass transistors 422. Sector bit lines 420 are coupled in pairs to the inputs of the sense amplifiers 424. Accordingly, for the embodiment depicted in FIG. 4A, there is one sense amplifier 424 located in the span of every four main bit lines 304. By selectively coupling each sense amplifier 424 to more than two main bit lines 304, the memory block 300 can make use of tighter packing of memory cells and main bit lines 304. To selectively couple each sense amplifier 424 to only two main bit lines 304, the spacing of the main bit lines 304 may need to increase, the dimensions of the sense amplifiers 424 may need to decrease, or the sense amplifiers 424 may need to be staggered on each end of the memory sector 400; each case, however, would generally lead to a detrimental increase in die size or a detrimental reduction in signal drive by the sense amplifiers 424. As shown in FIG. 4A, each sense amplifier 424 may be selectively coupled to one of eight main bit lines 304, and thus to a memory cell in one of eight columns of memory cells, through its associated sector bit lines 420.

Each output 425 of each sense amplifier 424 is coupled to a global bit line 426 through a selective coupling device, such as transistors 428. Sense amplifiers 424 are multiplexed in response to control signals from the column decoder circuit indicative of the target memory cell to provide the output of the target sense amplifier 424, and thus the data value of the target memory cell, on the global bit line 426. Using the foregoing memory array organization, large memory arrays having high-speed access and reduced die area are possible. While only two main bit lines 304 from each block 300 are selectively coupled to each sector bit line 420 in FIG. 4A, additional pairs of main bit lines 304 could be coupled to each sector bit line 420 through additional block pass transistors 422.

Figure 4B:
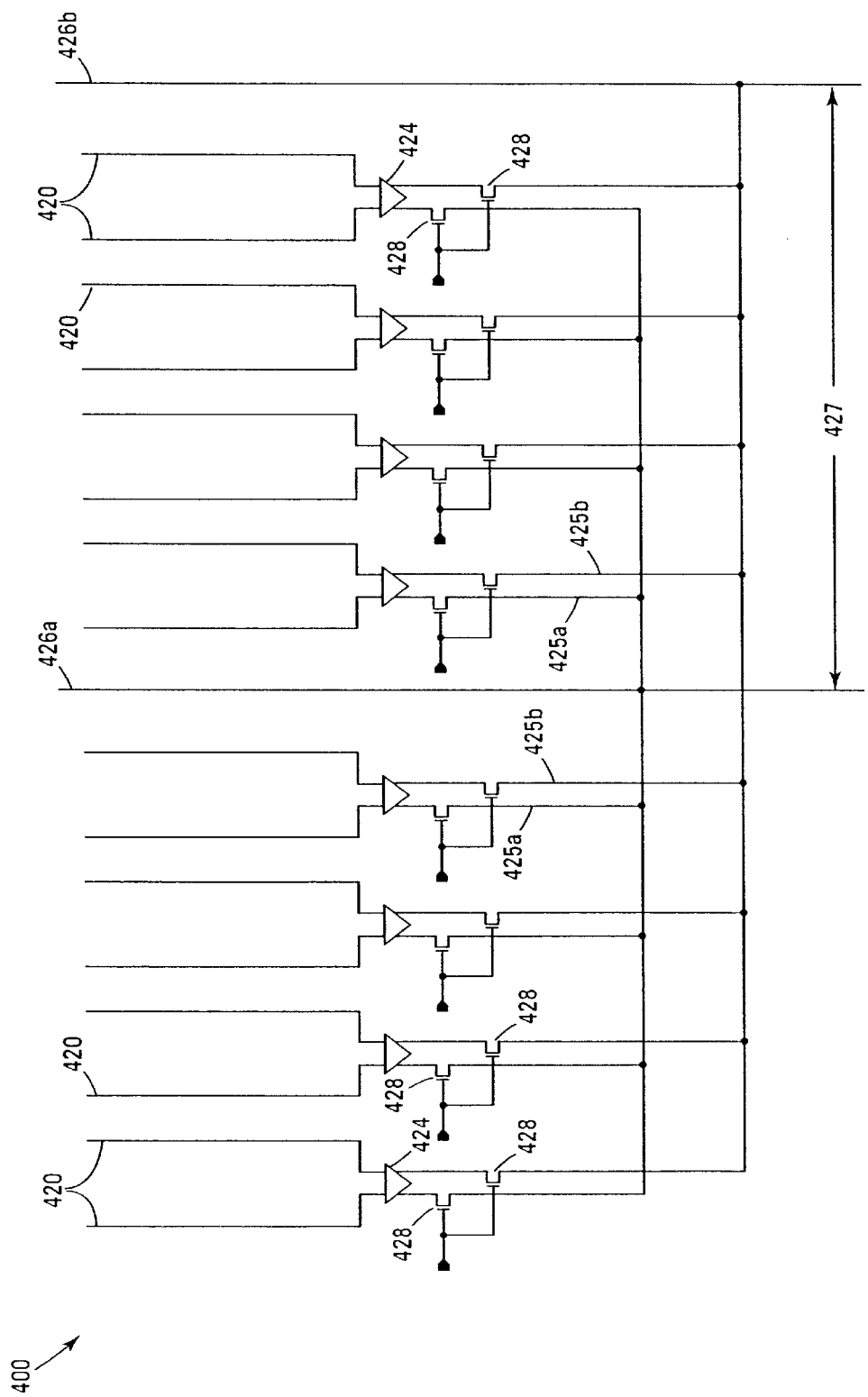
FIG. 4B is a schematic of a portion of a memory sector in accordance with another embodiment of the invention.

Although the sense amplifiers 424 in FIG. 4A are depicted as having a single output 425 coupled to a single global bit line 426, the sense amplifier output 425 is often a pair of output lines, one line for providing the data value and the other line for providing the binary complement of the data value. For such embodiments, each output 425 of a sense amplifier 424 is selectively coupled to one global bit line 426 of a global bit line pair. FIG. 4B is a schematic of one embodiment of a memory sector 400 showing the coupling of two outputs 425 from each sense amplifier 424 to a global bit line 426 of a global bit line pair. For clarity, memory blocks 300, main bit lines 304 and block pass transistors 422 are omitted in FIG. 4B. The first output 425a of a sense amplifier 424 is coupled to the first bit line 426a of the global bit line pair and the second output 425b of a sense amplifier 424 is coupled to the second bit line 426b of the global bit line pair 427 through transistors 428. Note that for this embodiment, the two transistors 428 selectively coupling each output of a sense amplifier 424 to a global bit line 426 are each controlled by the same control signal, and thus may be thought of as a single selective coupling device. For simplicity, subsequent figures will depict the output 425 of each sense amplifier 424 as a single output coupled to a global bit line 426. However, as is apparent from the discussion accompanying FIG. 4B, this can represent a pair of sense amplifier outputs coupled to a global bit line pair.

Figure 5:
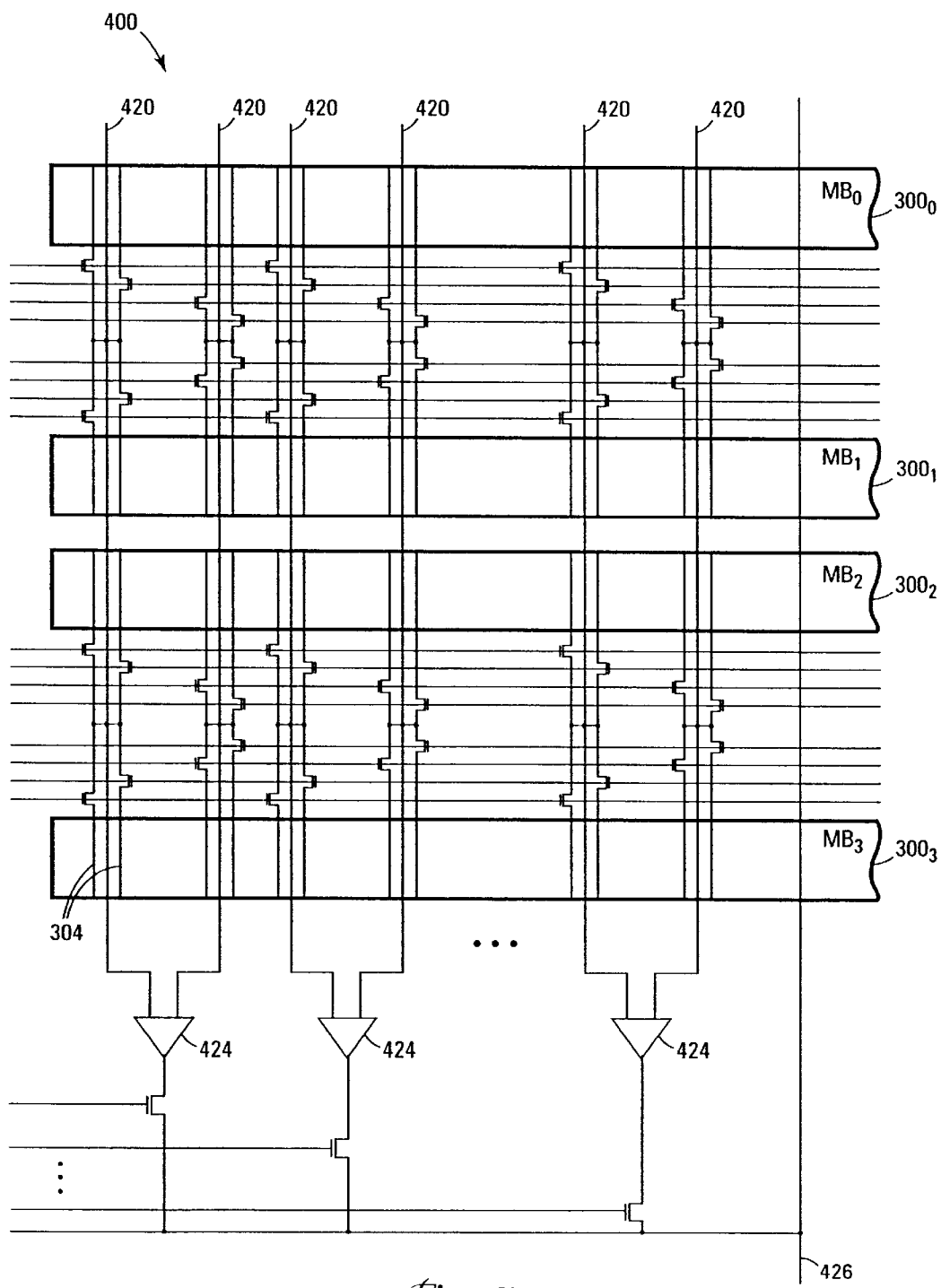
FIG. 5 is a schematic of a portion of a memory sector in accordance with a further embodiment of the invention.

FIG. 5 is a schematic of a portion of a memory sector 400 in accordance with another embodiment of the invention having more than two main memory blocks 300. In FIG. 5 and subsequent figures, certain detail and reference numbers are omitted in the interest of clarity as higher levels of the memory device are described. The omitted detail is apparent from the context of use with reference to preceding figures.

The memory sector 400 of FIG. 5 has four memory blocks $300_0$, $300_1$, $300_2$ and $300_3$, identified as main blocks $MB_0$, $MB_1$, $MB_2$ and $MB_3$, respectively. Main bit lines 304 from each memory block 300 are coupled to sector bit lines 420, with two main bit lines 304 from each memory block 300 selectively coupled to each sector bit line 420. Sector bit lines 420 extend to each memory block 300. As before, sector bit lines 420 are coupled in pairs to sense amplifiers 424. The outputs 425 of the sense amplifiers 424 are selectively coupled to global bit line 426. While four memory blocks 300 are depicted in FIG. 5, additional memory blocks 300 could be coupled to the sector bit lines 420 by extending the sector bit lines 420 to the additional memory blocks 300. Note that there is no requirement that the sector bit lines 420 extend across the memory block 300 farthest from the sense amplifiers (memory block $300_0$ in the embodiment of FIG. 5); a sector bit line 420 need only extend to a point of coupling to the block pass transistors used to couple the sector bit line 420 to its associated main bit lines 304.

Figure 6:
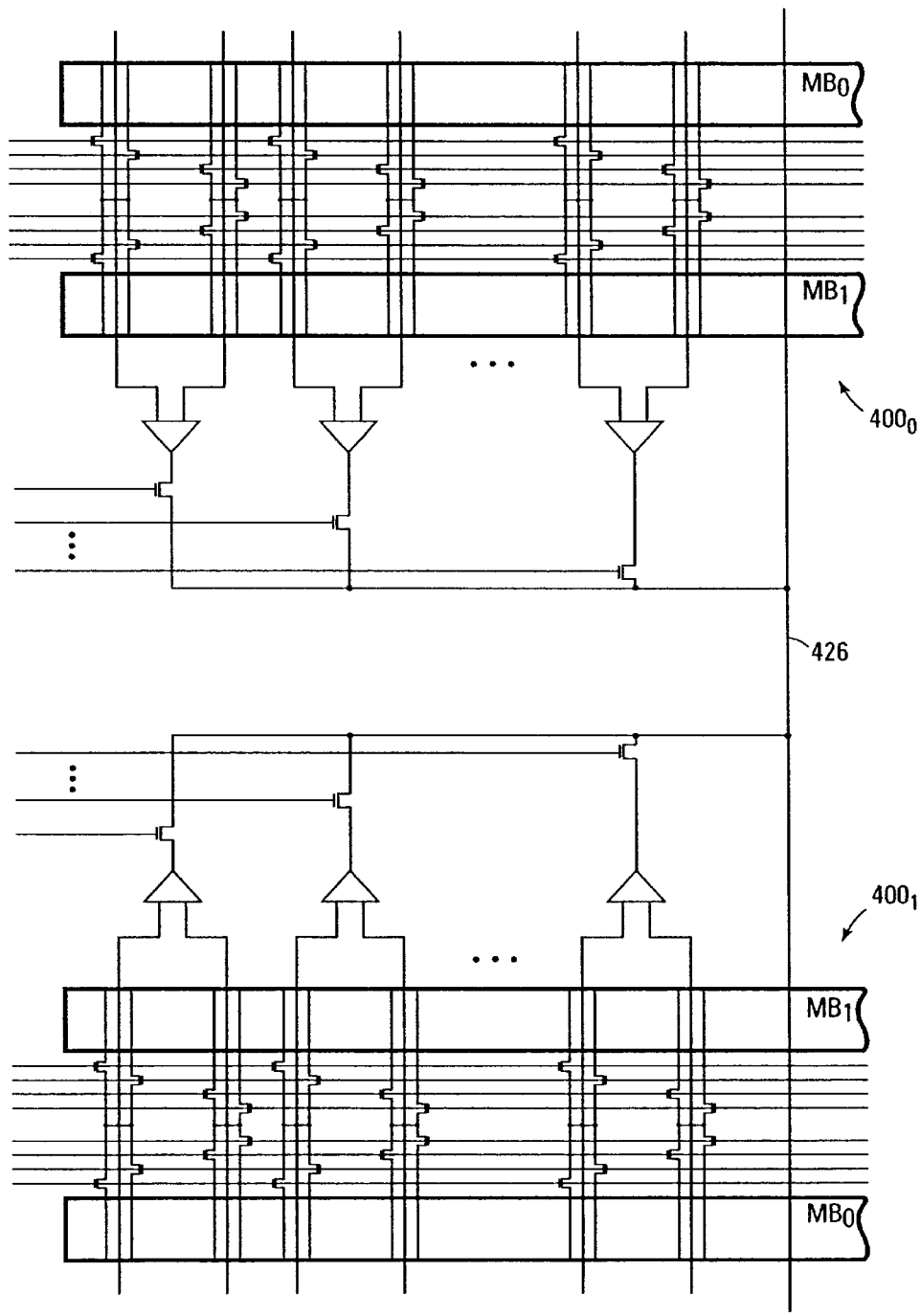
FIG. 6 is a schematic of portions of multiple memory sectors sharing a global bit line in accordance with one embodiment of the invention.

FIG. 6 is a schematic of portions of multiple memory sectors 400 sharing a global bit line 426 in accordance with one embodiment of the invention. In FIG. 6, two memory sectors $400_0$ and $400_1$ are selectively coupled to the global bit line 426 as described above. Note that memory sector $400_1$ is inverted from memory sector $400_0$ such that the sense amplifiers of memory sector $400_0$ are adjacent the sense amplifiers of the other memory sector $400_1$. While such inverted positioning is not necessary, this layout permits tighter packing than if each memory sector 400 were positioned with the same orientation. Additional memory sectors 400 could be selectively coupled to the global bit line 426 in similar fashion, inverting the positioning of each memory sector 400 relative to adjacent memory sectors 400.

Figure 7:
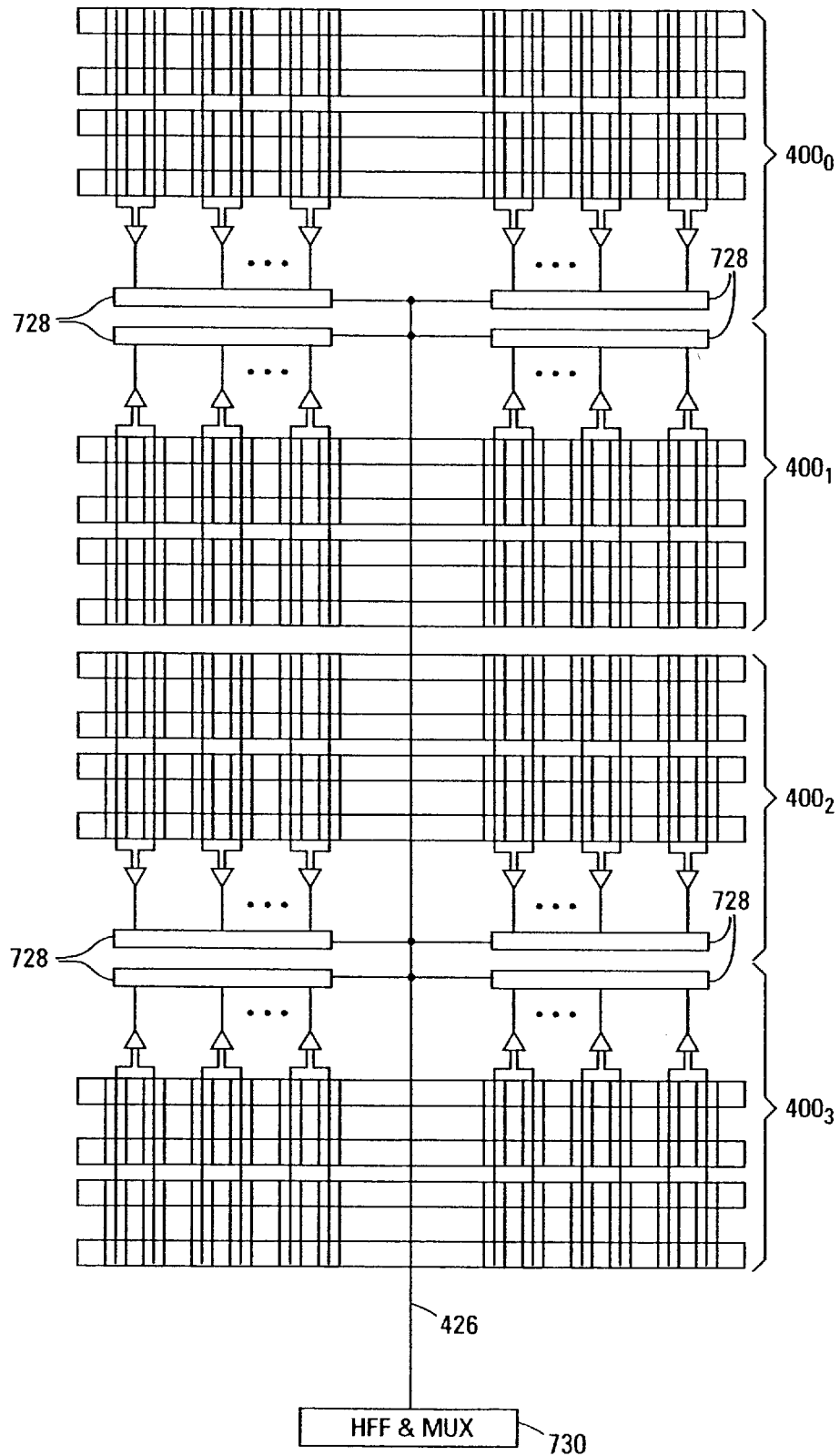
FIG. 7 is a schematic of portions of multiple memory sectors sharing a global bit line in accordance with another embodiment of the invention.

FIG. 7 is a schematic of portions of multiple memory sectors 400 sharing a global bit line 426 in accordance with another embodiment of the invention showing inclusion of additional memory sectors 400. The portion of a memory array depicted in FIG. 7 has four memory sectors 400. Additional memory sectors 400 could be added in similar fashion.

In FIG. 7, the four memory sectors $400_0$, $400_1$, $400_2$ and $400_3$ are selectively coupled to the global bit line 426 as described above through multiplexers 728 (including selective coupling devices such as transistors 428). The positioning of each memory sector 400 is inverted from its adjacent memory sector 400. While such inverted positioning is not necessary, this layout permits tighter packing than if each memory sector 400 were positioned with the same orientation. The global bit line 426 extends out from the memory sectors 400 to multiplexers and helper flip-flops (HFF) 730 for output from the memory device through the data output register. As shown in FIG. 7, a global bit line 426 may be coupled to sense amplifiers on both sides of the global bit line 426.

Advantageously, for one embodiment, the spacing of global bit lines 426 is selected to be the same as the spacing of the array ground 318. Thus, for an array ground 318 having a spacing of 16 columns, the spacing of the global bits lines 426 would be 16 columns such that each global bit line 426 is selectively coupled to 8 sense amplifiers 424 for each memory sector 400. By choosing such spacing, each global bit line 426 can be formed in the space vertically above the array ground 318, e.g., in the metal 2 (M2) layer in the fabrication process, and extending substantially parallel to the array ground 318. This permits formation of the global bit lines 426 without increasing the area of the semiconductor die.

Figure 8:
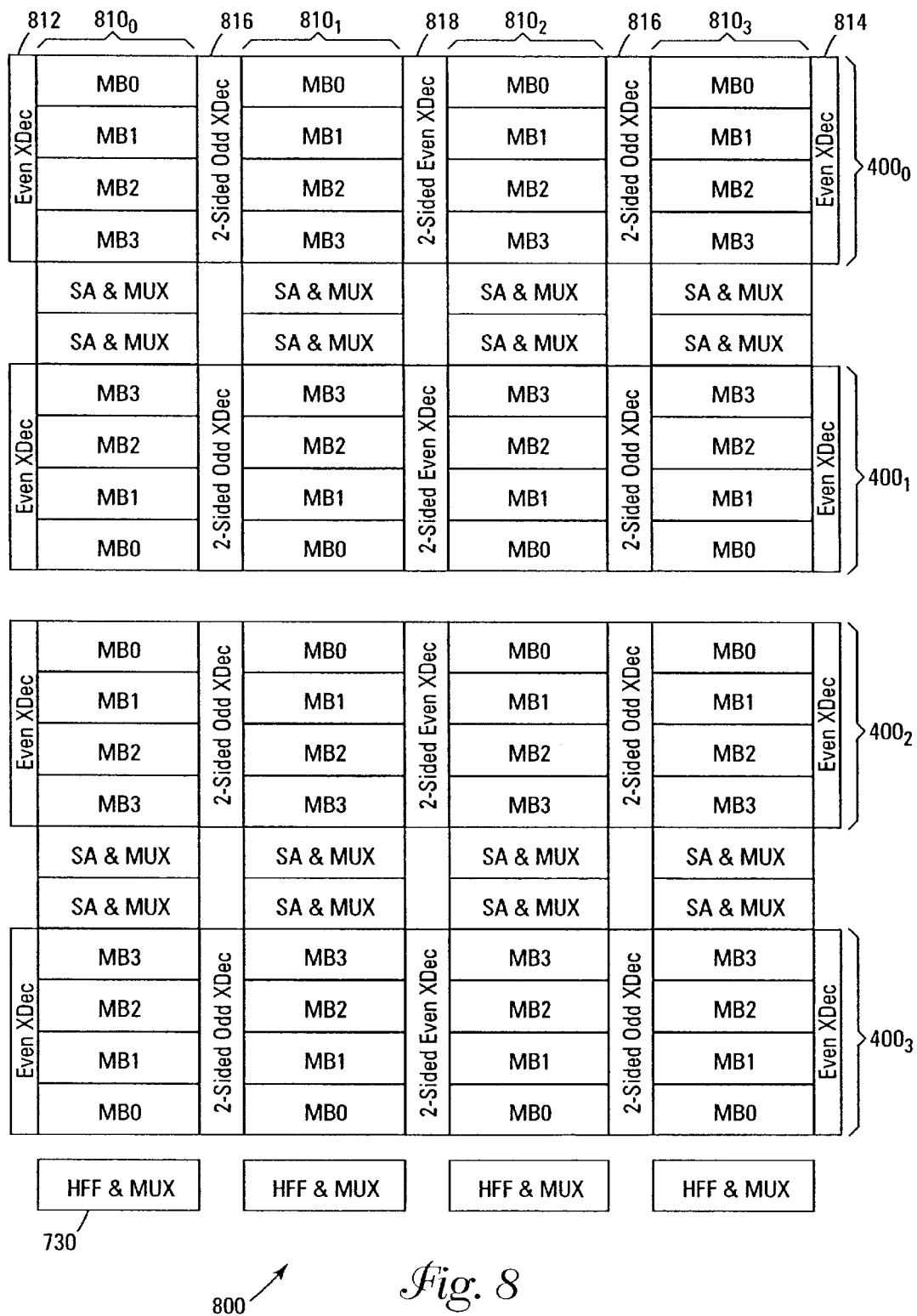
FIG. 8 is a block diagram of a memory bank in accordance with one embodiment of the invention.

While the foregoing embodiments depict only one global bit line 426 (or global bit line pair), it should be apparent that memory devices satisfying current storage requirements would generally have a large number of global bit lines 426. Each global bit line 426 is selectively coupled to sense amplifiers 424 as described above. For one embodiment having 64 Meg of storage (67,108,684 bits organized as 4,194,304 words by 16 bits), a memory array is divided into four memory banks. FIG. 8 is a block diagram of a memory bank 800 for such an embodiment, each memory bank 800 having four memory sectors 400. Each memory sector 400 in FIG. 8 has four memory blocks and 4,096 sense amplifiers selectively coupled to 512 global bit lines. Each global bit line extends to each of the four memory blocks in each of the four memory sectors. Note that a memory bank in accordance with the invention may contain one or more memory sectors of the various embodiments. Preferably, each memory sector 400 of the memory bank 800 contains the same number of memory blocks, with each memory block containing the same number of rows and columns of memory cells.

In the embodiment of FIG. 8, each memory sector 400, and thus each memory block, is subdivided into four sections, $810_0$, $810_1$, $810_2$ and $810_3$. An address applied to the memory device for a target memory cell in memory bank 800 may activate a word line or row in each memory sector 400 and across each section 810. While a word line may be activated in each memory sector 400, or even in each memory block, appropriate selection of block pass transistors and sense amplifiers can insure that no more than one memory cell will be coupled to any global bit line during a data read operation.

In a subdivided sector arrangement as shown in FIG. 8, access time to the target memory cell can be improved by locating row decoders (X decoders) on each side of the memory sector 400 and between each section 810 of the memory sector 400. For one embodiment, each memory sector 400 of memory bank 800 includes a one-sided row decoder 812 and 814 on each side of the memory sector 400, and two-sided row decoders 816 and 818 between adjacent sections 810 of the memory sector 400. Each row decoder 812, 814, 816 and 818 addresses either a first group of rows, e.g., even rows, or the remaining or second group of rows, e.g., odd rows. Each section 810 of the memory sector 400 has a first row decoder on its first side for addressing the first group of rows in the memory sector 400, and a second row decoder on its second or opposite side for addressing the remaining group of rows in the memory sector 400. For sections 810 numbering a power of two, each one-sided row decoder 812 and 814 addresses the same group of rows. As shown in FIG. 8, one-sided row decoder 812 addresses even rows of the section $810_0$, two-sided row decoders 816 address odd rows of the sections $810_0$, $810_1$, $810_2$ and $810_3$, two-sided row decoder 818 addresses even rows of the sections $810_1$ and $810_2$, and one-sided row decoder 814 addresses even rows of the section $810_3$.

The global bit lines of the memory bank 800 are arranged similar to the arrangement of global bit lines 426 shown in FIG. 7. Each global bit line of memory bank 800 is selectively coupled to eight sense amplifiers in each sector, which may include four sense amplifiers per sector on each side of the global bit line or all selectively coupled sense amplifiers on the same side of the global bit line. Thus, in the embodiment depicted in FIG. 8, each global bit line is selectively coupled to a total of 32 sense amplifiers. The global bit lines may be formed in the M2 layer using the spacing of the array ground formed in the M1 layer. The memory bank 800 further multiplexes the global bit lines for input to helper flip-flops to provide the necessary signal drive for data output.

It should be recognized that while the structure of memory bank 800 depicted in FIG. 8 exemplifies an array organization in accordance with the invention, it is not a complete depiction of all circuitry associated with a memory bank. Other circuitry may be included between and surrounding the memory sectors 400, such as column decoders and write circuitry. Furthermore, other memory banks in accordance with the invention may contain fewer or more memory sectors, and each memory sector may be subdivided into fewer or more sections. Additionally, memory arrays may contain fewer or more memory banks.

The terms memory cell, memory block, memory sector, and memory bank have been used to describe increasingly higher-level views of a memory array. However, the invention includes memory array structures as described herein relative to these terms, and should not be limited to any preconceived notion of what these terms may convey.

CONCLUSION

Various embodiments of the invention have been shown to have architectures suited for high-performance memory devices, with particular reference to synchronous non-volatile memory devices. Memory devices in accordance with the various embodiments of the invention include blocks of memory cells arranged in columns with each column of memory cells coupled to a main bit line. Such memory devices further include sector bit lines having multiple main bit lines selectively coupled to each sector bit line, with each sector bit line extending to main bit lines in each memory block of a memory sector. Sector bit lines are coupled to sensing devices and the output of each sensing device is selectively coupled to a global bit line, with each global bit line selectively coupled to more than one sensing device. For embodiments having multiple sectors, the global bit lines may extend to more than one sector. The global bit lines are multiplexed and input to helper flip-flops for output to the data output registers of the memory device. Accordingly, the relationship between data inputs to global bit lines, global bit lines to sensing devices, and sensing devices to main lines is, in each case, typically a one-to-many relationship in the various embodiments of the invention. This array organization permits tight packing of individual memory cells with high-speed access capabilities.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory array, comprising:
   a first memory block having columns of memory cells coupled to a plurality of first main bit lines;
   a second memory block having columns of memory cells coupled to a plurality of second main bit lines;
   a plurality of sector bit lines, wherein each sector bit line is coupled to at least two main bit lines from the plurality of first main bit lines and at least two main bit lines from the plurality of second main bit lines through selective coupling devices;
   a plurality of sensing devices having inputs coupled to the plurality of sector bit lines, each sensing device further having at least one output; and
   at least one global bit line coupled to the outputs of the plurality of sensing devices through selective coupling devices.

2. The memory array of claim 1, wherein the at least one output of each sensing device includes a first output and a second output, further wherein each first output is coupled to a first global bit line of a global bit line pair and each second output is coupled to a second global bit line of a global bit line pair.

3. The memory array of claim 1, wherein each sensing device is coupled to two sector bit lines and each sector bit line is coupled to two main bit lines from the plurality of first main bits lines and two main bit lines from the plurality of second main bit lines through selective coupling devices such that each sensing device may be selectively coupled to one column of memory cells selected from the group consisting of four columns of memory cells in the first memory block and four columns of the memory cells in the second memory block.

4. The memory array of claim 1, further comprising at least one additional memory block having columns of memory cells, wherein each additional memory block has a plurality of main bit lines coupled to the plurality of sector bit lines through selective coupling devices.

5. The memory array of claim 1, wherein the memory cells are non-volatile memory cells, wherein each global bit line is formed in a space above an array ground for the non-volatile memory cells, and wherein each global bit line is substantially parallel with its associated array ground.

6. The memory array of claim 5, wherein each global bit line is formed in a metal 2 layer of a semiconductor fabrication process and each array ground is formed in a metal 1 layer of the semiconductor fabrication process.

7. The memory array of claim 1, wherein the first memory block and the second memory block are each subdivided into a plurality of sections.

8. A memory array, comprising:
- at least two memory blocks, each memory block having columns of non-volatile memory cells coupled to a plurality of main bit lines;
- a plurality of sector bit lines, wherein each sector bit line extends to each of the at least two memory blocks;
- a plurality of block pass transistors coupled between each plurality of main bit lines and the plurality of sector bit lines to selectively couple each main bit line to a sector bit line, wherein each main bit line is coupled to only one sector bit line through a block pass transistor and each sector bit line is coupled to more than one main bit line, each through a block pass transistor;
- a plurality of sense amplifiers each having at least one output, each sense amplifier further having inputs coupled to the plurality of sector bit lines, wherein two sector bit lines are coupled to the inputs of each sense amplifier; and
- a plurality of global bit lines, wherein each sense amplifier output is coupled to only one global bit line through a selective coupling device and each global bit line is coupled to more than one sense amplifier output, each through a selective coupling device.

9. The memory array of claim 8, wherein the at least one output of each sensing device includes a first output and a second output, further wherein each first output is coupled to a first global bit line of a global bit line pair and each second output is coupled to a second global bit line of a global bit line pair.

10. The memory array of claim 9, wherein each selective coupling device comprises:
- a first transistor coupled between the first output of a sense amplifier and the first global bit line of a global bit line pair; and
- a second transistor coupled between the second output of the sense amplifier and the second global bit line of the global bit line pair;
- wherein the first and second transistor are each controlled by the same control signal.

11. A memory array, comprising:
- a first memory block having columns of non-volatile memory cells coupled to a plurality of first main bit lines;
- a second memory block having columns of non-volatile memory cells coupled to a plurality of second main bit lines;
- a plurality of first sector bit lines, wherein each first sector bit line is selectively coupled to at least two main bit lines from the plurality of first main bit lines and at least two main bit lines from the plurality of second main bit lines;
- a plurality of first sensing devices each having at least one output, the plurality of first sensing devices further having inputs coupled to the plurality of first sector bit lines;
- a third memory block having columns of non-volatile memory cells coupled to a plurality of third main bit lines;
- a fourth memory block having columns of non-volatile memory cells coupled to a plurality of fourth main bit lines;
- a plurality of second sector bit lines, wherein each second sector bit line is selectively coupled to at least two main bit lines from the plurality of third main bit lines and at least two main bit lines from the plurality of fourth main bit lines;
- a plurality of second sensing devices each having at least one output, the plurality of second sensing devices further having inputs coupled to the plurality of second sector bit lines; and
- at least one global bit line selectively coupled to the outputs of the plurality of first sensing devices and the outputs of the plurality of second sensing devices, wherein each global bit line is selectively coupled to at least one sensing device of the plurality of first sensing devices and at least one sensing device of the plurality of second sensing devices.

12. The memory array of claim 11, wherein each first sensing device is coupled to two first sector bit lines and each first sector bit line is selectively coupled to two main bit lines from the plurality of first main bits lines and two main bit lines from the plurality of second main bit lines such that each first sensing device is selectively coupled to four columns of the non-volatile memory cells in the first memory block and four columns of the non-volatile memory cells in the second memory block.

13. The memory array of claim 11, wherein each second sensing device is coupled to two second sector bit lines and each second sector bit line is selectively coupled to two main bit lines from the plurality of third main bits lines and two main bit lines from the plurality of fourth main bit lines such that each second sensing device is selectively coupled to four columns of the non-volatile memory cells in the third memory block and four columns of the non-volatile memory cells in the fourth memory block.

14. The memory array of claim 11, further comprising at least one additional memory block having columns of non-volatile memory cells coupled to a plurality of main bit lines selectively coupled to the plurality of first sector bit lines and at least one additional memory block having columns of non-volatile memory cells coupled to a plurality of main bit lines selectively coupled to the plurality of second sector bit lines.

15. The memory array of claim 11, further comprising a plurality of third sensing devices selectively coupled to non-volatile memory cells of at least one additional memory block, wherein each global bit line is selectively coupled to at least one sensing device of the plurality of third sensing devices.

16. A memory bank, comprising:
- a first number of memory sectors each having a second number of memory blocks, each memory block having a third number of columns of non-volatile memory cells with each column of non-volatile memory cells coupled to a main bit line;
- a fourth number of sector bit lines in each memory sector, wherein each sector bit line extends to each memory block in its associated memory sector and wherein the fourth number is one-half the third number;

a plurality of block pass transistors, wherein one block pass transistor is coupled between each main bit line and a sector bit line to selectively couple each main bit line to a sector bit line, wherein each main bit line is coupled to only one sector bit line through a block pass transistor and each sector bit line is coupled to two main bit lines in each memory block, each through a block pass transistor;

a plurality of sense amplifiers in each memory sector, wherein each sense amplifier has inputs coupled to two sector bit lines in its associated memory sector, further wherein each sense amplifier has at least one output; and a plurality of global bit lines, wherein each sense amplifier output is coupled to only one global bit line through a selective coupling device and each global bit line is coupled to an output of more than one sense amplifier in each memory sector of the memory bank, each through a selective coupling device.

17. The memory array of claim 16, wherein the first number, the second number, the third number and the fourth number are each a power of two.

18. The memory array of claim 16, wherein each memory block of each memory sector is subdivided into a plurality of sections.

19. The memory array of claim 16, wherein each memory sector has an inverted positioning relative to adjacent memory sectors.

20. The memory array of claim 16, wherein the at least one output of each sense amplifier includes a first output and a second output, further wherein each first output is coupled to a first global bit line of a global bit line pair and each second output is coupled to a second global bit line of a global bit line pair, still further wherein each first global bit line is coupled to more than one first output and each second global bit line is coupled to more than one second output.

21. A memory bank, comprising:

a first number of memory sectors each having a second number of memory blocks, each memory block having a third number of columns of non-volatile memory cells with each column of non-volatile memory cells coupled to a main bit line;

a fourth number of sector bit lines in each memory sector, wherein each sector bit line extends to each memory block in its associated memory sector and wherein the fourth number is one-half the third number, further wherein each sector bit line is selectively coupled to two main bit lines in each memory block and each main bit line is selectively coupled to only one sector bit line;

a plurality of sense amplifiers in each memory sector, wherein each sense amplifier has inputs coupled to two sector bit lines in its associated memory sector, further wherein each sense amplifier has at least one output; and a plurality of global bit lines coupled to the plurality of sense amplifiers, wherein each sense amplifier output is selectively coupled to only one global bit line and each global bit line is selectively coupled to more than one sense amplifier in each memory sector of the memory bank.

22. The memory array of claim 21, wherein the first number, the second number, the third number and the fourth number are each a power of two.

23. The memory array of claim 21, wherein each memory block of each memory sector is subdivided into a plurality of sections.

24. The memory array of claim 21, wherein each memory sector has an inverted positioning relative to adjacent memory sectors.

25. The memory array of claim 21, wherein the at least one output of each sensing device includes a first output and a second output, further wherein each first output is coupled to a first global bit line of a global bit line pair and each second output is coupled to a second global bit line of a global bit line pair.

26. A memory array, comprising:

at least two first memory blocks, each first memory block having columns of non-volatile memory cells coupled to a plurality of first main bit lines;

a plurality of first sector bit lines, wherein each first sector bit line extends to each first memory block;

a plurality of first block pass transistors coupled between each plurality of first main bit lines and the plurality of first sector bit lines to selectively couple each first main bit line to a first sector bit line, wherein each first main bit line is selectively coupled to only one first sector bit line and each first sector bit line is selectively coupled to more than one first main bit line;

a plurality of first sense amplifiers each having at least one output, each first sense amplifier further having inputs coupled to the plurality of first sector bit lines, wherein two first sector bit lines are coupled to each first sense amplifier;

at least two second memory blocks, each second memory block having columns of non-volatile memory cells coupled to a plurality of second main bit lines;

a plurality of second sector bit lines, wherein each second sector bit line extends to each second memory block;

a plurality of second block pass transistors coupled between each plurality of second main bit lines and the plurality of second sector bit lines to selectively couple each second main bit line to a second sector bit line, wherein each second main bit line is selectively coupled to only one second sector bit line and each second sector bit line is selectively coupled to more than one second main bit line;

a plurality of second sense amplifiers each having at least one output, each second sense amplifier further having inputs coupled to the plurality of second sector bit lines, wherein two second sector bit lines are coupled to each second sense amplifier; and a plurality of global bit lines selectively coupled to the outputs of the first and second pluralities of sense amplifiers, wherein each global bit line is selectively coupled to at least one sense amplifier from the plurality of first sense amplifiers and at least one sense amplifier from the plurality of second sense amplifiers, further wherein each.

27. The memory array of claim 26, wherein the at least one output of each sensing device includes a first output and a second output, further wherein each first output is coupled to a first global bit line of a global bit line pair and each second output is coupled to a second global bit line of a global bit line pair.

28. A memory array, comprising:

at least one memory bank, each memory bank having at least one memory sector, each memory sector comprising:

a first memory block having columns of non-volatile memory cells coupled to a plurality of first main bit lines;

a second memory block having columns of non-volatile memory cells coupled to a plurality of second main bit lines;

a plurality of sector bit lines, wherein each sector bit line is selectively coupled to at least two main bit lines from the plurality of first main bit lines and at least two main bit lines from the plurality of second main bit lines;

a plurality of sensing devices having inputs coupled to the plurality of sector bit lines, each sensing device further having at least one output; and at least one global bit line coupled to the outputs of the plurality of sensing devices through selective coupling devices.

29. The memory array of claim 28, wherein each sensing device is coupled to two sector bit lines and each sector bit line is selectively coupled to two main bit lines from the plurality of first main bits lines of its associated memory sector and two main bit lines from the plurality of second main bit lines of its associated memory sector such that each sensing device is selectively coupled to four columns of the non-volatile memory cells in the first memory block of its associated memory sector and four columns of the non-volatile memory cells in the second memory block of its associated sector.

30. The memory array of claim 28, further comprising at least one additional memory block in each memory sector having columns of non-volatile memory cells coupled to a plurality of main bit lines selectively coupled to the plurality of sector bit lines of its associated sector.

31. The memory array of claim 28, wherein each global bit line is formed in a space above an array ground and each global bit line is substantially parallel with its associated array ground.

32. The memory array of claim 28, wherein each memory block of each memory sector is subdivided into a plurality of sections.

33. The memory array of claim 28, wherein a number of memory banks is greater than or equal to four, a number of memory sectors per memory bank is greater than or equal to four, and a number of memory blocks per memory sector is greater than or equal to four.

34. The memory array of claim 28, wherein each memory sector has an inverted positioning relative to adjacent memory sectors.

35. The memory array of claim 28, wherein the at least one output of each sensing device includes a first output and a second output, further wherein each first output is coupled to a first global bit line of a global bit line pair and each second output is coupled to a second global bit line of a global bit line pair.

36. A memory array, comprising:
at least one memory bank, each memory bank having at least one memory sector, each memory sector comprising:
at least two memory blocks, each memory block having columns of non-volatile memory cells coupled to a plurality of main bit lines;
a plurality of sector bit lines, wherein each sector bit line extends to each memory block of its associated memory sector;
a plurality of block pass transistors coupled between each plurality of main bit lines and the plurality of sector bit lines to selectively couple each main bit line to a sector bit line, wherein each main bit line is selectively coupled to only one sector bit line of its associated memory sector and each sector bit line is selectively coupled to more than one main bit line of its associated memory sector;

a plurality of global bit lines, wherein each sense amplifier is selectively coupled to only one global bit line and each global bit line is selectively coupled to more than one sense amplifier of each memory sector of its associated memory bank;

a plurality of sense amplifiers each having at least one output, each sense amplifier further having inputs coupled to the plurality of sector bit lines, wherein each sense amplifier is coupled to two sector bit lines of its associated sector; and a plurality of global bit lines, wherein each sense amplifier output is selectively coupled to only one global bit line and each global bit line is selectively coupled to a sense amplifier output of more than one sense amplifier of each memory sector of its associated memory bank.

37. The memory array of claim 36, wherein each memory block of each memory sector is subdivided into a plurality of sections.

38. The memory array of claim 36, wherein each memory sector has an inverted positioning relative to adjacent memory sectors.

39. The memory array of claim 36, wherein the at least one output of each sensing device includes a first output and a second output, further wherein each first output is coupled to a first global bit line of a global bit line pair and each second output is coupled to a second global bit line of a global bit line pair.

40. A memory array, comprising:
at least one memory bank, each memory bank having at least one memory sector, each memory sector comprising:
at least two memory blocks, each memory block having columns of non-volatile memory cells coupled to a plurality of main bit lines;
a plurality of sector bit lines, wherein each sector bit line extends to each memory block of its associated memory sector, further wherein each sector bit line is selectively coupled to more than one main bit line of its associated memory sector and each main bit line is selectively coupled to only one sector bit line of its associated memory sector;
a plurality of sense amplifiers each having at least one output, each sense amplifier further having inputs coupled to the plurality of sector bit lines, wherein each sense amplifier is coupled to two sector bit lines of its associated sector; and
a plurality of global bit lines, wherein each sense amplifier output is selectively coupled to only one global bit line and each global bit line is selectively coupled to a sense amplifier output of more than one sense amplifier of each memory sector of its associated memory bank.

41. The memory array of claim 40, wherein each memory block of each memory sector is subdivided into a plurality of sections.

42. The memory array of claim 40, wherein each memory sector has an inverted positioning relative to adjacent memory sectors.

43. The memory array of claim 40, wherein the at least one output of each sensing device includes a first output and a second output, further wherein each first output is coupled to a first global bit line of a global bit line pair and each second output is coupled to a second global bit line of a global bit line pair.

44. A memory array, comprising:
a first number of memory banks each having a second number of memory sectors, each memory sector having a third number of memory blocks, each memory block having a fourth number of columns of non-volatile memory cells with each column of non-volatile memory cells coupled to a main bit line;
a fifth number of sector bit lines in each memory sector, wherein each sector bit line extends to each memory block in its associated memory sector and wherein the fifth number is one-half the fourth number, further wherein each sector bit line is coupled to two main bit lines in each memory block, each through a selective coupling device, and each main bit line is coupled through a selective coupling device to only one sector bit line;
a plurality of sense amplifiers in each memory sector, wherein each sense amplifier is coupled to two sector bit lines in its associated memory sector, further wherein each sense amplifier has at least one output; and
a plurality of global bit lines in each memory bank, wherein each sense amplifier output is coupled through a selective coupling device to only one global bit line and each global bit line is coupled to an output of more than one sense amplifier in each memory sector of its associated memory bank, each through a selective coupling device.

45. The memory array of claim 44, wherein the first number, the second number, the third number, the fourth number and the fifth number are each a power of two.

46. The memory array of claim 44, wherein the first number is greater than or equal to 4, the second number is greater than or equal to 4, the third number is greater than or equal to 4, the fourth number is greater than or equal to 16,384, and the fifth number is greater than or equal to 8,192.

47. The memory array of claim 44, wherein each memory block of each memory sector is subdivided into a plurality of sections.

48. The memory array of claim 44, wherein each memory block of each memory sector is subdivided into four sections.

49. The memory array of claim 44, wherein each memory sector has an inverted positioning relative to adjacent memory sectors.

50. The memory array of claim 44, wherein the at least one output of each sensing device includes a first output and a second output, further wherein each first output is coupled to a first global bit line of a global bit line pair and each second output is coupled to a second global bit line of a global bit line pair.

51. A memory device, comprising:
a row decoder circuit;
a column decoder circuit; and
a memory array coupled to the row decoder circuit and the column decoder circuit, the memory array comprising:
a first memory block having columns of memory cells coupled to a plurality of first main bit lines and rows of memory cells coupled to a plurality of first word lines;
a second memory block having columns of memory cells coupled to a plurality of second main bit lines and rows of memory cells coupled to a plurality of second word lines;
a plurality of sector bit lines, wherein each sector bit line is selectively coupled to at least two main bit lines from the plurality of first main bit lines and at least two main bit lines from the plurality of second main bit lines;
a plurality of sensing devices coupled to the plurality of sector bit lines; and
at least one global bit line selectively coupled to the plurality of sensing devices;
wherein at least one word line selected from the group consisting of the plurality of first word lines and the plurality of second word lines is activated in response to a control signal received from the row decoder circuit; and
wherein at least one main bit line selected from the group consisting of the plurality of first main bit lines and the plurality of second main bit lines is coupled to a sector bit line in response to a control signal received from the column decoder circuit, further wherein each sector bit line is coupled to no more than one main bit line in response to the control signal received from the column decoder.

52. A memory device, comprising:
a row decoder circuit;
a column decoder circuit; and
a memory array coupled to the row decoder circuit and the column decoder circuit, the memory array comprising:
at least one memory bank, each memory bank having at least one memory sector, each memory sector comprising:
a first memory block having columns of non-volatile memory cells coupled to a plurality of first main bit lines;
a second memory block having columns of memory cells coupled to a plurality of second main bit lines;
a plurality of sector bit lines, wherein each sector bit line is selectively coupled to at least two main bit lines from the plurality of first main bit lines and at least two main bit lines from the plurality of second main bit lines;
a plurality of sensing devices coupled to the plurality of sector bit lines; and
at least one global bit line selectively coupled to the plurality of sensing devices in each memory sector of its associated memory bank.

53. A memory device, comprising:
a row decoder circuit;
a column decoder circuit; and
a memory array coupled to the row decoder circuit and the column decoder circuit, the memory array comprising:
at least one memory bank, each memory bank having at least one memory sector, each memory sector comprising:
at least two memory blocks, each memory block having columns of non-volatile memory cells coupled to a plurality of main bit lines and rows of non-volatile memory cells coupled to a plurality of word lines;
a plurality of sector bit lines, wherein each sector bit line extends to each memory block of its associated memory sector;
a plurality of block pass transistors coupled between each plurality of main bit lines and the plurality of sector bit lines to selectively couple each main bit line to a sector bit line, wherein each main bit line is selectively coupled to only one sector bit line of its associated memory sector and each sector bit line is selectively coupled to more than one main bit line of its associated memory sector;

a plurality of sense amplifiers each having at least one output, each sense amplifier further having inputs coupled to the plurality of sector bit lines, wherein each sense amplifier is coupled to two sector bit lines of its associated sector; and a plurality of global bit lines, wherein each sense amplifier output is selectively coupled to only one global bit line and each global bit line is selectively coupled to a sense amplifier output of more than one sense amplifier of each memory sector of its associated memory bank.

54. The memory device of claim 53, wherein the row decoder circuit further comprises a plurality of one-sided row decoders and a plurality of two-sided row decoders, wherein each memory sector is subdivided into a plurality of sections, wherein a one-sided row decoder is located on each of a first side and an opposite side of each memory sector and a two-sided row decoder is located between adjacent sections of each memory sector, and wherein each section of each memory sector has a row decoder on one side for addressing a first group of the plurality of rows and a row decoder on an opposite side for addressing a remaining group of the plurality of rows.

55. A memory device, comprising:

a row decoder circuit;

a column decoder circuit; and a memory array coupled to the row decoder circuit and the column decoder circuit, the memory array comprising:

at least one memory bank, each memory bank having at least one memory sector, each memory sector comprising:

at least two memory blocks, each memory block having columns of non-volatile memory cells coupled to a plurality of main bit lines;

a plurality of sector bit lines, wherein each sector bit line extends to each memory block of its associated memory sector, further wherein each sector bit line is selectively coupled to more than one main bit line of its associated memory sector and each main bit line is selectively coupled to only one sector bit line of its associated memory sector;

a plurality of sense amplifiers each having at least one output, each sense amplifier further having inputs coupled to the plurality of sector bit lines, wherein each sense amplifier is coupled to two sector bit lines of its associated sector; and a plurality of global bit lines, wherein each sense amplifier output is selectively coupled to only one global bit line and each global bit line is selectively coupled to a sense amplifier output of more than one sense amplifier of each memory sector of its associated memory bank.

56. The memory device of claim 55, wherein the row decoder circuit further comprises a plurality of one-sided row decoders and a plurality of two-sided row decoders, wherein each memory sector is subdivided into a plurality of sections, wherein a one-sided row decoder is located on each of a first side and an opposite side of each memory sector and a two-sided row decoder is located between adjacent sections of each memory sector, and wherein each section of each memory sector has a row decoder on one side for addressing a first group of the plurality of rows and a row decoder on an opposite side for addressing a remaining group of the plurality of rows.

57. The memory array of claim 56, wherein the at least one output of each sensing device includes a first output and a second output, further wherein each first output is coupled to a first global bit line of a global bit line pair and each second output is coupled to a second global bit line of a global bit line pair.

58. A memory device, comprising:

a row decoder circuit;

a column decoder circuit; and a memory array coupled to the row decoder circuit and the column decoder circuit, the memory array comprising:

a first number of memory banks each having a second number of memory sectors, each memory sector having a third number of memory blocks, each memory block having a fourth number of columns of non-volatile memory cells with each column of non-volatile memory cells coupled to a main bit line;

a fifth number of sector bit lines in each memory sector, wherein each sector bit line extends to each memory block in its associated memory sector and wherein the fifth number is one-half the fourth number, further wherein each sector bit line is selectively coupled to two main bit lines in each memory block and each main bit line is selectively coupled to only one sector bit line:

a plurality of sense amplifiers in each memory sector, wherein each sense amplifier has inputs coupled to two sector bit lines in its associated memory sector, further wherein each sense amplifier has at least one output: and a plurality of global bit lines in each memory bank, wherein each sense amplifier output is selectively coupled to only one global bit line and each global bit line is selectively coupled to an output of more than one sense amplifier in each memory sector of its associated memory bank.

59. The memory array of claim 58, wherein the at least one output of each sensing device includes a first output and a second output, further wherein each first output is coupled to a first global bit line of a global bit line pair and each second output is coupled to a second global bit line of a global bit line pair.

* * * * *

UNITED STATES PATENT AND TRADEMARK OFFICE
CERTIFICATE OF CORRECTION

PATENT NO. : 6,657,913 B2
DATED : December 2, 2003
INVENTOR(S) : Abedifard et al.

It is certified that error appears in the above-identified patent and that said Letters Patent is hereby corrected as shown below:

Column 16,
Line 53, replace "amplifiers, further wherein each." with -- amplifiers. --

Signed and Sealed this

Twenty-second Day of June, 2004

JON W. DUDAS
*Acting Director of the United States Patent and Trademark Office*